(12) United States Patent
Leroux et al.

(10) Patent No.: US 6,278,956 B1
(45) Date of Patent: Aug. 21, 2001

(54) METHOD OF LOCATING A FAILED LATCH IN A DEFECTIVE SHIFT REGISTER

(75) Inventors: Alain Leroux, Montigny-sur-Loing; Dominique Petit, St Fargeau-Ponthiery; Sylvain Posson, Bois-le-Roi, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/290,783

(22) Filed: Apr. 13, 1999

(30) Foreign Application Priority Data

Apr. 30, 1998 (EP) .................................................. 98480027

(51) Int. Cl.⁷ .................................................. G01R 31/28
(52) U.S. Cl. ........................... 702/117; 702/108; 702/107
(58) Field of Search .................................... 702/107, 108, 702/117; 714/721, 738, 741, 742, 744; 365/201, 183.01, 189.09, 208, 226; 324/158.1, 763, 765, 73.1, 758.1

(56) References Cited

U.S. PATENT DOCUMENTS

| | | | |
|---|---|---|---|
| 4,242,635 | * 12/1980 | Burns ................................ | 324/158 R |
| 5,294,883 | * 3/1994 | Akiki et al. ....................... | 324/158 R |
| 5,371,457 | * 12/1994 | Lipp .................................. | 324/158.1 |
| 5,483,170 | * 1/1996 | Beasley et al. ..................... | 324/537 |
| 5,519,335 | * 5/1996 | Thomas .............................. | 324/765 |
| 5,668,745 | * 9/1997 | Day ..................................... | 364/580 |
| 5,717,696 | * 2/1998 | Gabillard et al. .................. | 371/21.4 |
| 5,726,997 | * 3/1998 | Teene ................................. | 371/22.3 |
| 5,773,990 | * 6/1998 | Wilstrup et al. ..................... | 324/765 |
| 5,912,562 | * 6/1999 | Pappert et al. ...................... | 324/765 |
| 5,917,331 | * 6/1999 | Persons ............................... | 324/765 |
| 5,923,601 | * 7/1999 | Wendell .............................. | 365/201 |
| 5,929,650 | * 7/1999 | Pappert et al. ....................... | 324/763 |
| 6,169,408 | * 1/2000 | Kantor et al. ....................... | 324/752 |
| 6,175,245 | * 1/2001 | Bowe et al. ......................... | 324/765 |

\* cited by examiner

*Primary Examiner*—Patrick Assouad
*Assistant Examiner*—Carol S. W. Tsai
(74) *Attorney, Agent, or Firm*—H. Daniel Schnurmann

(57) ABSTRACT

A method for locating a failing latch in a defective shift register having P latches connected in series fabricated in an integrated circuit chip. The chip is depassivated to expose its upper metalized layer, and it is in the chamber of a scanning electron microscope (SEM) having sharp voltage contrast capabilities. Clock signals are generated to properly exercise the shift register. A string of N latches, wherein $1 \leq N \leq P$, typically N=P/2 is first selected and the stimuli are applied to the latches to allow the output net of the last latch of the string to toggle at a frequency of about 1 Hz. The SEM beam is focused on the area which encompasses the last latch, so that, if the latch output net blinks on the SEM screen, the string under observation is deemed to be good. Then, another, more extended string is selected and the above procedure is repeated. If no blinking is detected in the newly observed string, the failing latch belongs to that string and the above procedure must also be repeated on the latches forming the string until the failing latch is identified. In a preferred embodiment, the stimuli are supplied by a stand-alone exerciser. In another embodiment, the stimuli are delivered by a computer driven pattern generator.

10 Claims, 6 Drawing Sheets

(A)

(B)

METHOD OF LOCATING A FAILED LATCH IN A DEFECTIVE SHIFT REGISTER

FIELD OF INVENTION

The invention relates to the test of integrated circuits (IC), and more particularly to a method for locating a failing latch in a defective shift register. The present method uses a fast and inexpensive diagnostic of shift registers using for this purpose a scanning electron microscope with voltage contrast capability.

BACKGROUND OF THE INVENTION

Many Very Large Scale Integration (VLSI) silicon chips employ the so-called Level Sensitive Scan Design (LSSD) methodology in order to attain high test coverage for the logic circuits built in the IC chips. This design methodology permits chip latches to be used effectively as pseudo-I/O's, allowing an easier stimulation and readout of internal nets (or nodes). Since an output of each latch is connected to an input of the next, all the latches within the IC may be configured into one or more shift registers. Each register will, hereinafter, be referred to as a LSSD "scan chain" or "scan string".

A significant drawback of LSSD resides in the fact that shift registers occupy a substantial amount of real estate. To date, an advanced silicon chip may include as many as 50,000 latches typically divided in about 50 shift register. Admittedly, it would be too time consuming to exhaustively test all the scan chains in the IC chip.

During chip test, the correct operation of the shift register is verified by two tests know as Flush and Scan tests. In the first case, the registers are set in a Flush mode, i.e., the scan clocks are held active, so that they behave as logical delay lines. During the Scan test, two scan clock signals are pulsed without overlapping in order to verify that the register has the correct number of latches.

FIG. 1a illustrates the operation of a conventional five-latch LSSD shift register. The Scan-In signal SI remains at a low level except during the third couple of scan clock signals. During this cycle, the A clock signal loads the scan-in data in the master latch of the master/slave latch configuration, then the B clock signal transfers this data from the master to the slave latch thereof. Since the output of the slave latch is connected to the input of the next latch, data will be loaded in latch 2 during cycle number 4. During this cycle 4, the Scan-In signal SI, which reverted back to a low, causes latch 1 to be loaded with a "0". When the B clock in cycle 7 switches to a high, the "1" that was loaded in latch 1 during cycle 3 appears on the Scan-Out signal SO. One cycle later, this SO reverts back to "0" and the data is entered during cycle 4.

FIG. 1b illustrates the case of a non-LSSD shift register. The only difference resides in the use of a single clock signal to exercise the register instead of two. As apparent from FIGS. 1a–1b, the Scan Out signal SO is the same in both cases.

Although these tests are simple and may be applied very quickly, they are capable of only testing up to 30% of the logic. In reality, the chip fallout from Flush and Scan tests is often as high as 50% of the total chip fallout. This is due to a high probability of scan chain failure in the presence of two or more random defects, so that a larger percentage of defective chips will fail at least one of these tests.

Although shift registers are formed from rather simple circuits, it is never easy to diagnose any given fault, especially when the malfunction is due to an open circuit. This failure can be attributed to either the latch itself, to the connection between two latches or, frequently, to the connecting wires that feed the clock signals to the latch. To encompass all these potential sources of failures, one should normally consider a failing cell in the shift register rather than a failing latch which is somewhat more limitative. However, it will be referred to, henceforth, for sake of simplicity, as a failing latch.

The method described in U.S. Pat. No. 4,630,270, of common assignee, has been extensively used in the art. The method described allows diagnosing a failing latch in a shift register by observing the Idd current which exhibits transient spikes generated by each latch switching when the shift register is set in a Flush mode, and when a square wave is applied to its scan input pad. The method is based upon discovery that Idd current variations stop, i.e., the Idd current remains at a constant value when the incoming data arrives at the failing latch. By displaying Idd current variations on an oscilloscope, the rank of the faulty latch can be accurately determined, since it is possible to identify some of the latches forming the register. However, with recent improvements in the semiconductor manufacturing technology, ICs are becoming faster, leading to smaller Idd spikes, both in amplitude and duration, making it more difficult to estimate the rank of the faulty latch with any degree of accuracy. Recently, with the introduction of 0.5 $\mu$ lithography, the precision of the diagnostic made by this method is substantially degraded (the faulty latch can only be identified as belonging to a group of 10 to 20 latches), so that this method results in a very imprecise and thus unacceptable diagnostic. As a direct consequence, failure analysis becomes significantly more difficult because more nets must be visually examined for each defective shift register. Moreover, for each latch of the group mentioned above, output nets linking a latch as well as the clock nets feeding the latch (i.e., A, B and possibly C clocks in case of an LSSD latch), all require full checking. Finally, the success rate, i.e., the percentage of defects identified by failure analysis is low.

Moreover, in today's semiconductor industry, the time allotted for responding is a determining factor in any failure analysis of logic ICs. Typical turn around time (TAT) for ASIC diagnostic and physical failure analysis is mostly driven by the time required to localize the failure.

OBJECTS AND SUMMARY OF THE INVENTION

It is therefore a primary object of the present invention to provide a method for locating a failing latch in a defective shift register with high rate of success.

It is another object to provide a method for locating a failing latch in a defective shift register consisting of LSSD and non-LSSD latches.

It is still another object to provide a method for locating a failing latch in a defective shift register that has a short turn around time, thereby allowing for an easy and fast localization of a failure.

These and other related objects are achieved by the method of the present invention, wherein in order to identify a failing latch in a defective shift register, the method of the present invention does rely on using the Scan mode, which is common to LSSD and non-LSSD latches, in lieu of the conventional Flush mode.

In one a aspect of the invention, a string of N serially connected latches within P latches of the defective shift register having failed functional test is selected. This can be efficiently implemented using a 'dichotomy' approach, wherein in the event where a shift register has a very large number of latches, the first string to be selected corresponds to the first half of the shift register, i.e., from latch 1 to latch N with N=P/2. The last latch of the selected string, i.e., latch N, is toggled and observed under a Scanning Electron Microscope (SEM) having voltage contrast capabilities. The latch toggling is obtained by switching from a "1" to a "0" and vice-versa at a frequency defined by the user (e.g., at a frequency on the order of 1 Hz) while the logic content of all remaining latches remain at their existing binary value.

In another aspect of the invention, the defective chip is depassivated and placed in a SEM chamber. Next, it is electrically powered and stimulated to exercise the selected string of the register in order allow toggling the last latch thereof. Aided by a graphical tool which coarsely displays the position of each latch of the string, the SEM beam is focused on the zone where the searched latch is located. If the latch N works properly, its output net "blinks" on the SEM screen and, more significantly, it blinks alone, pinpointing its locating easily and accurately. In this case, the first string is deemed to be formed by only good latches, and a new string is then selected, e.g. latches ranking from 1 to P*3/4 (i.e., latch P*3/4 will be the next one to be toggled). In the event where a failing latch prior to the last one of the string is detected, data in the last latch cannot be altered, and its output net will not blink. This procedure is repeated until the output net of the last latch of a determined string does not blink, indicating the presence of a failing latch. Aided by an appropriate graphic tool which displays the coarse location of each latch, one can easily find the first failing latch and determine its exact location.

In order to toggle the last latch of a selected string to produce the desired blinking effect, the following steps are executed:

1) clear all latches of the string
2) wait, preferably, half a second
3) load a "1" only in the last latch of the string
4) wait, preferably, half a second
5) return to step 1

In the preferred embodiment, the necessary stimuli are supplied by a stand-alone exerciser, i.e. a dedicated electronic circuit which performs the functions necessary for getting the last latch to blink, as explained above. In another embodiment, the stimuli are generated and delivered by a computer driven pattern generator.

BRIEF DESCRIPTION OF THE DRAWINGS

The novel features believed to be characteristic of this invention are set forth in the appended claims. The invention itself, however, as well as these and other objects, aspects and advantages thereof will be best understood by reference to the following detailed description of an illustrated preferred embodiment to be read in conjunction with the accompanying drawings.

FIG. 4b shows the internal timing diagram corresponding to the stand-alone exerciser illustrated in FIG. 4a.

DETAILED DESCRIPTION OF THE INVENTION

Figure 1:
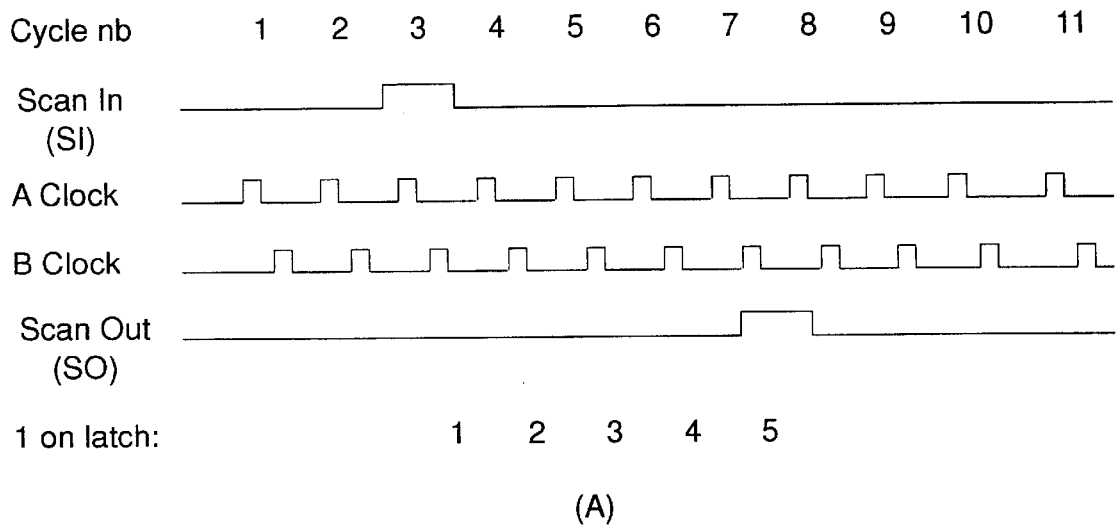
FIGS. 1a–1b respectively show timing diagrams illustrating the working of a conventional LSSD and non-LSSD shift register.
Figure 1:
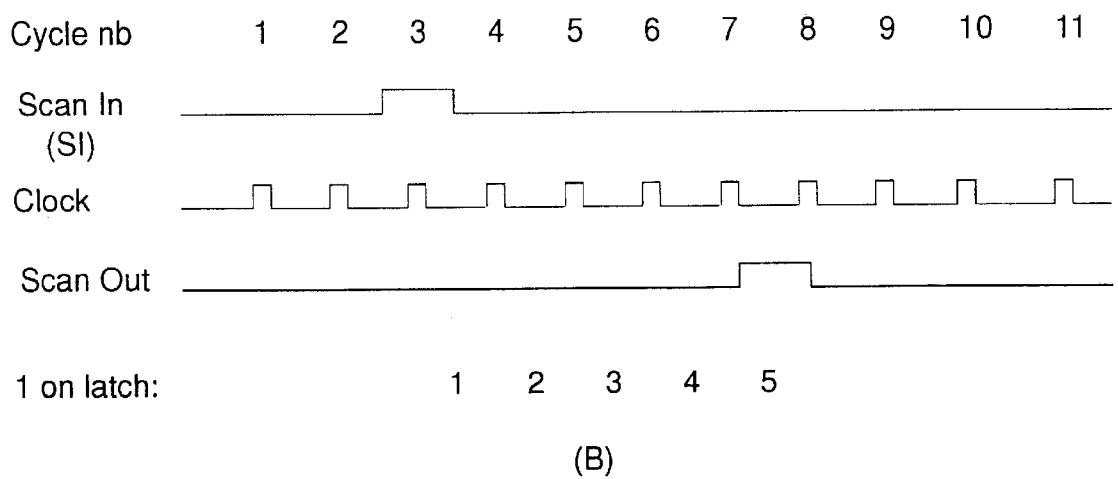

To improve the visual examination mentioned above, a scanning electron microscope (SEM) with good voltage contrast capability, such as the model IDS-5000 or IDS-10000, which is commercially sold by Schlumberger Industries, Montrouge, France, has been preferably used. This kind of SEM allows for an immediate reading of the logic value appearing on internal nets of a silicon chip using an electron beam, in a technique know in the art as "contactless testing". After depassivation, the defective chip (or wafer) is placed in the vacuum chamber of the SEM and connected to a power supply. The chip requires to be depassivated to expose the upper metal layers forming its interconnecting scheme. Other similar techniques can also be used with equal success. By way of example, photo-emission or IR laser techniques can be used for the same purposes. In the latter case, the photon or IR beam can be employed to illuminate the wafer (or chip) back side instead of an electron beam illuminating the depassivated wafer (or chip) top surface. In this instance, it will be necessary to thin the substrate as usual to render it transparent to the beam. As known to those skilled in the art, a wafer (or chip) thickness in the 50–100 $\mu$m range is adequate in that regard. Further details on this technique may be found in an article by David P. Vallett, et al., entitled Finding fault with deep-submicron ICs, published in IEEE Spectrum, October 1997, pp. 39–45.

An external pulse generator used to exercise the shift register that failed functional test. On the screen of the SEM, all the nets at "0" appear white (since they tend to eject secondary electrons), while nets at "1" appear black, since they tend to retain secondary electrons. As a consequence, nets which alternate between "0" and "1" appear as blinking (keeping in mind that only the top two metal layers may be observed in this way). The defective shift register is placed in Flush mode (i.e., by holding the scan clock signals at an active level), a 1 Hz square signal, referred to as the Scan-In (SI) signal is applied at the Scan-In pad. As a result, the whole valid portion of the register blinks as the SI signal propagates.

The exact latch where the signal fails to propagate is pinpointed next. In principle this may seem quite simple but in reality, because of the complex design of the shift register at the chip surface, finding one's way along a path containing hundreds of latches with, typically, twice as many nets blinking together, reveals to be an extremely difficult task. Although bench diagnostic results permit limiting the number of latches that need to be examined on the screen of the SEM tool, navigating and searching for the appropriate latch output nets is, in practice, a painstaking task.

The above technique proved to be unsatisfactory and thus required further development. Ultimately, it was improved in accordance with the method of the present invention and which will now be explained by reference to FIGS. 2–6.

Figure 2:
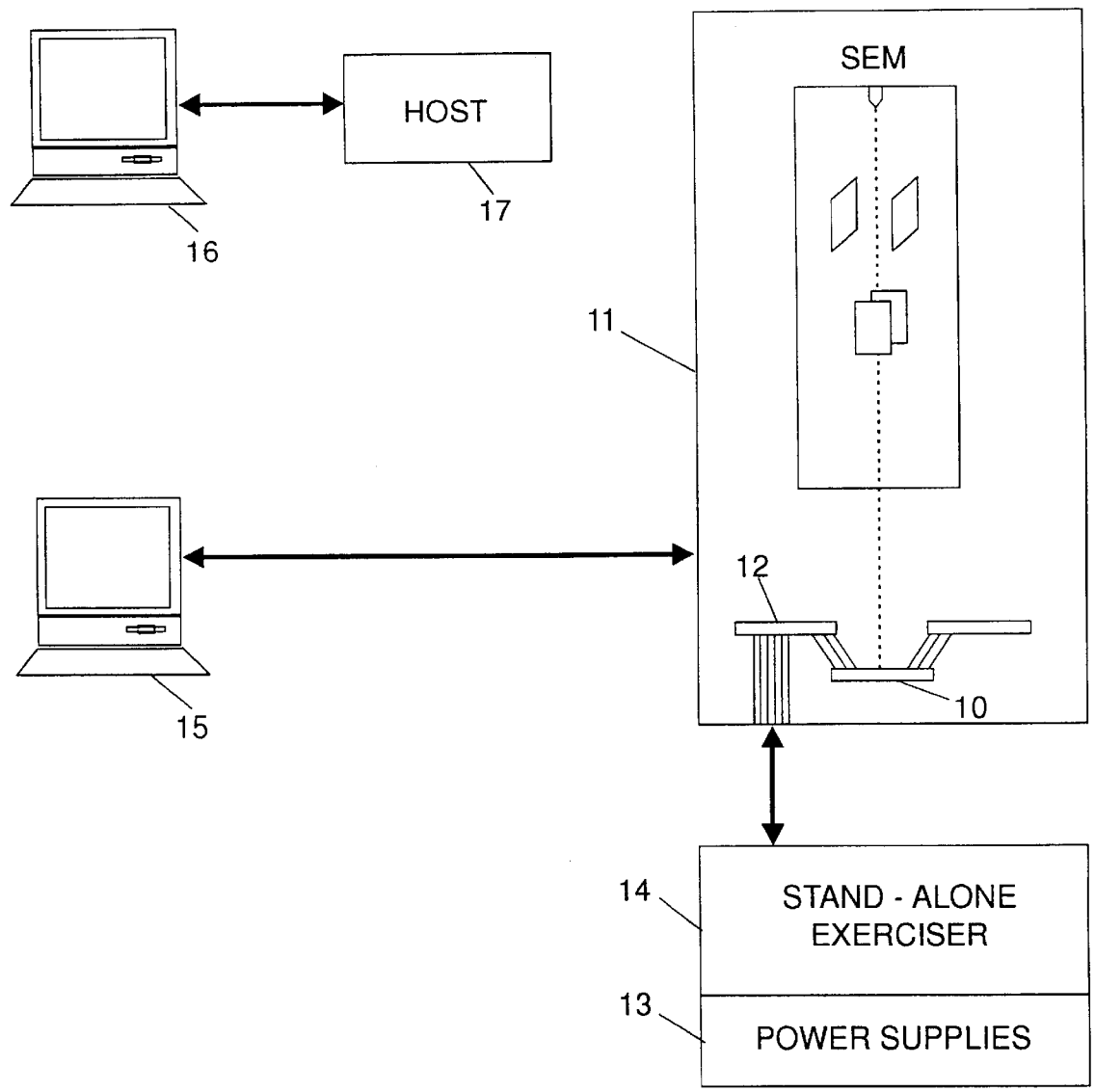
FIG. 2 is a block diagram of the system for locating a failing latch in a defective shift register, in accordance with the present invention, and which uses a stand-alone exerciser.

Referring to FIG. 2, the depassivated chip 10 is placed in the vacuum chamber of the SEM tool having adequate voltage contrast capability, bearing numeral 11. The chip pads are connected to the outside by way of a probe card 12 (or wire-bonded on a pin grid array socket, if no suitable probe card is available) to ensure proper working of the defective shift register to be tested. In particular, the chip power pads are connected to appropriate power supplies referenced 13.

In the preferred embodiment depicted in FIG. 2, the Scan In/Out and clock input pads are connected to a stand-alone exerciser 14 specially designed for this purpose, and which will be described in more details hereinafter. The image generated by the SEM tool is available in real time on the screen display unit 15, referred to as the SEM screen. Display unit 16 broadly shows both the location and the shape of the net corresponding to the output of the latch being toggled. This coarse locating results in a direct exploitation of the mask data. Display unit 16 can be part of the SEM tool but, more frequently, it is totally independent thereof. By way of example, it can be the screen of a separate workstation or a terminal that processes mask data stored in host 17, referred to as the terminal screen.

Figure 3:
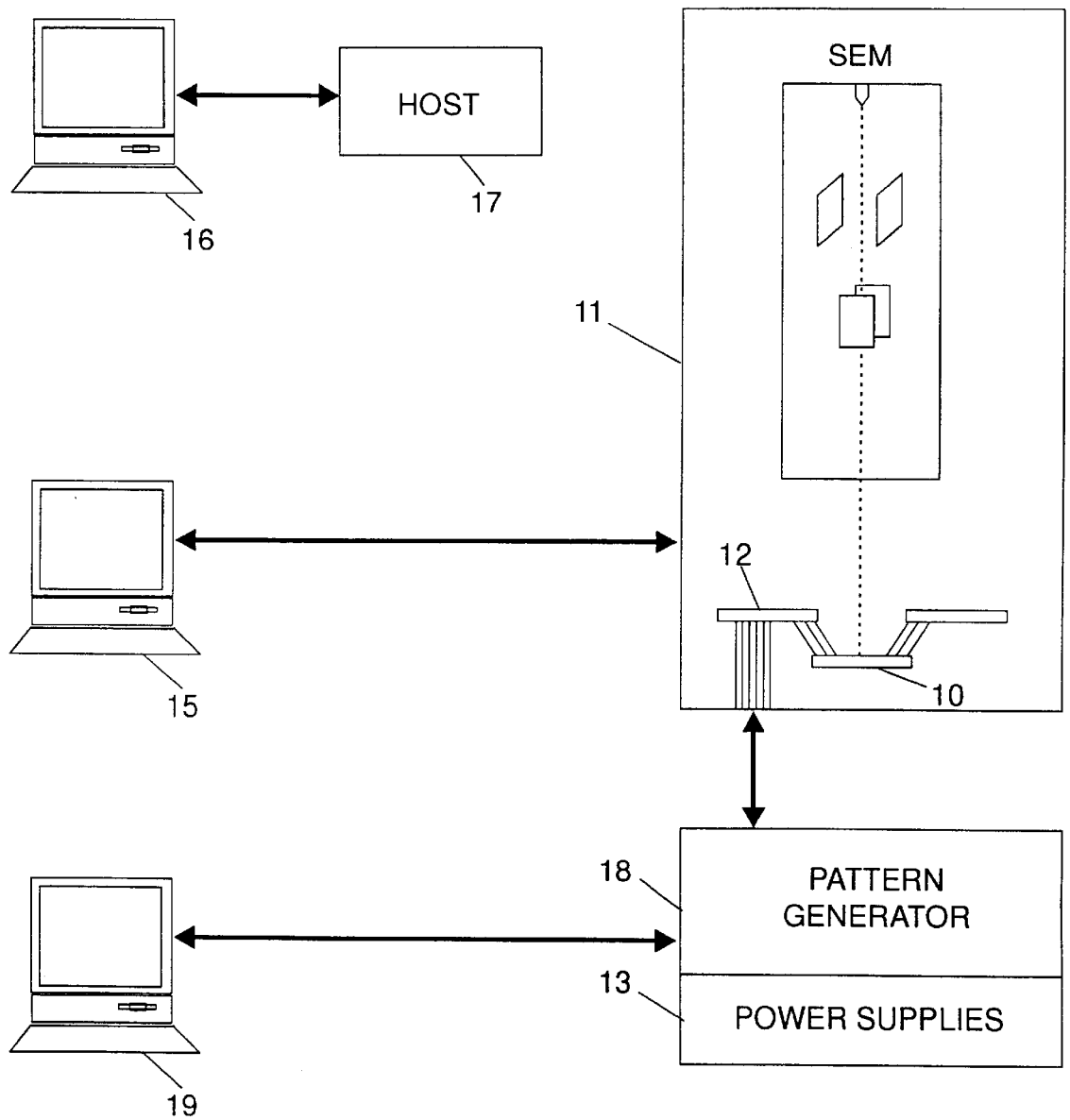
FIG. 3 is a block diagram of the system illustrating another embodiment of the present invention using a computer driven test pattern generator.

In anther embodiment shown in FIG. 3, the shift register and clock input pads are connected to a pattern generator 18 driven by a software operated computer 19 through an IEEE-488 interface. The stand-alone exerciser and the pattern generator have both the same function of supplying the chip 10 with all the necessary stimuli signals to obtain the desired toggling.

As a preliminary statement, it should be understood that in order to identify a failing latch in a defective shift register, the inventive method relies on the "Scan" mode, which is common to both LSSD and non-LSSD circuits, so that it is possible to test either type of circuits. Non-LSSD circuits only require a single active-on-edge clock signal and D-type latches.

For a shift register of, e.g., 800 latches, a string of 400 latches is selected and the last latch of the string, i.e., latch 400 is toggled. From the mask data, the area which includes the latch output net that blinks is first displayed on the screen of the workstation 16 for coarse locating. Then, the IDS-5000 beam is moved to the appropriate zone to display the output net of the latch under consideration on the screen of the IDS-5000 tool. If latch 400 works, its output net blinks; thereupon, latch 600 is handled next. Alternatively, if the net does not blink, the failing latch belongs to that string, in which case, latch 200 is handled nest, etc. It typically takes 10 minutes to find a failing latch with this method.

Figure 4A:
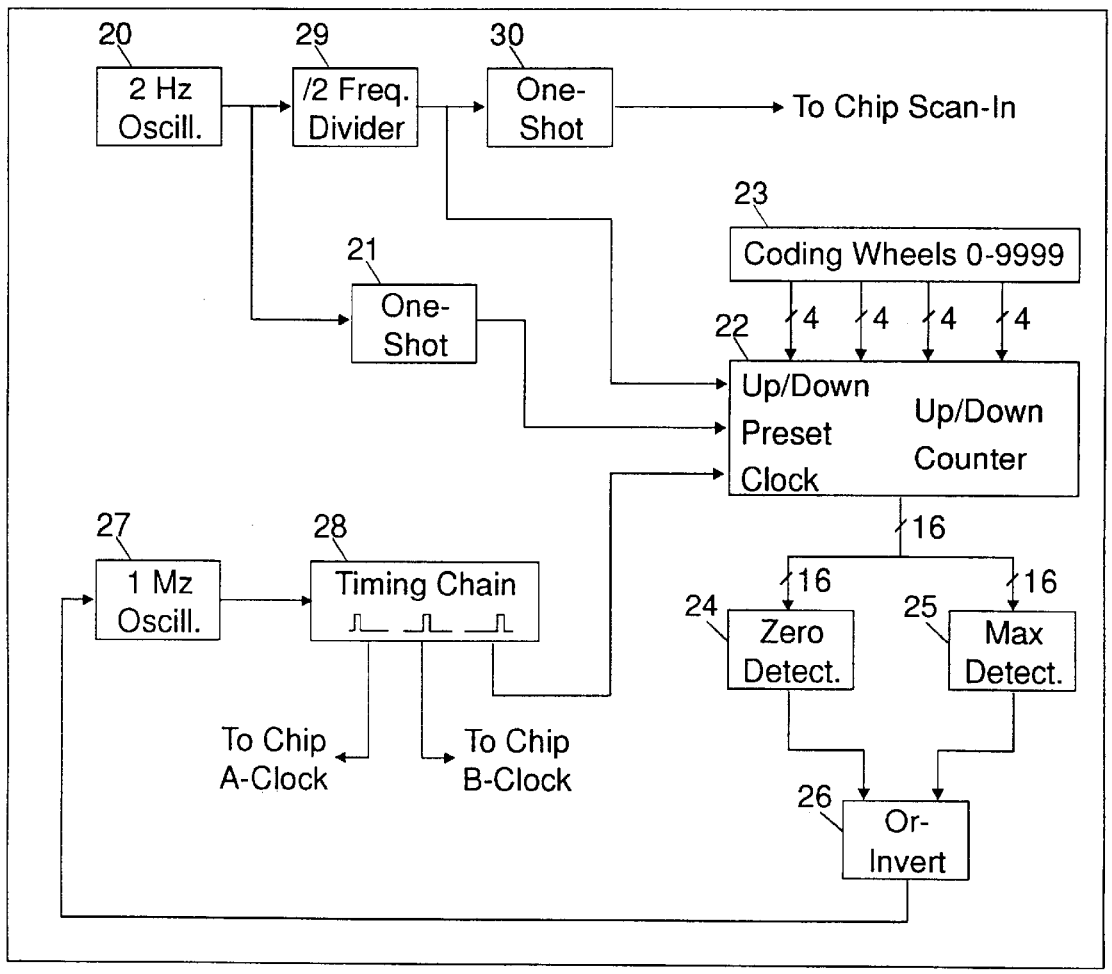
FIG. 4a is a block diagram of a typical implementation of the stand-alone exerciser used with reference to FIG. 2.

FIG. 4a shows a typical circuit block implementation of the stand-alone exerciser 14 of FIG 2. Referring to FIG 4a, the 2 Hz oscillator 20 triggers single-shot circuit 21 to generate a short pulse. This pulse presets the 16-bit up-down counter 22 with the data N present on the 4 coding wheels 23. The number N corresponds to the rank of the latch to be toggled. This rank is normally different from zero and from the maximum value that can be handled by exerciser 14. In this case, as apparent in FIG. 4a, the maximum is 9999. The outputs of detectors 24 and 25 are at a low level after this preset operation. As a result, the high level present at the output of the OR-invert circuit 26 enables the 1 Hz oscillator 27, which in turn drives timing chain 28 to generate triplets of sequential pulses at each cycle of oscillator 27, for the chip clock signal A, for the chip block signal B, and for the clock signals of up-down counter 22.

As soon as single-shot 21 is triggered, the frequency divider 29 (it divides by a factor 2) toggles. Assuming for sake of illustration, that the signal switches to a high. In this case, the up-down counter 22 is set to count down at a 1 MHz rate, starting from N until 16 low levels are respectively present at the 16 outputs of up-down counter 22. Note that when it switches to "1", the frequency divider 29 triggers another single-shot 30, producing a 500 ns wide pulse. This signal, which is applied to the Scan-In SI input to the register, will remain at a high for the first few A and B clock signals, returning to a low level during all the subsequent clock signals. As a result, a single "1" is propagated through the latches forming the register, with all subsequent values being 0. When all the 16 outputs of up-down counter 22 are at the low level, the output of zero-detector 24 switches to a high. In turn, the OR-invert circuit 26 that follows produces a low level, inhibiting oscillator 27 and stopping propagation of a "1" along the register. This state remains frozen during about half a second, until oscillator 20 completes its cycle.

At that instant, the up-down counter 22 is again preset with value N. Zero-detector 24 is deactivated, circuit 26 output switches to "1", enabling once again oscillator 27. However, this time, the frequency divider output 29 has toggled again and switched down to a low. As a result, up-down counter 22 is now counting up, from N to the maximum value (in the instant case 9999). When this maximum value is reached, the output of max-detector 25 switches to a high, OR-invert circuit 26 output switches to a low, and oscillator 27 stops. Since the maximum value is greater than the length of the string, the "1" that was present on latch N at the end of the count-down step is scanned along all latches N+1, . . . , etc. of the string, and finally exits prior to the end of the count-up step, leaving all N latches of the string filled with 0's.

Figure 4B:
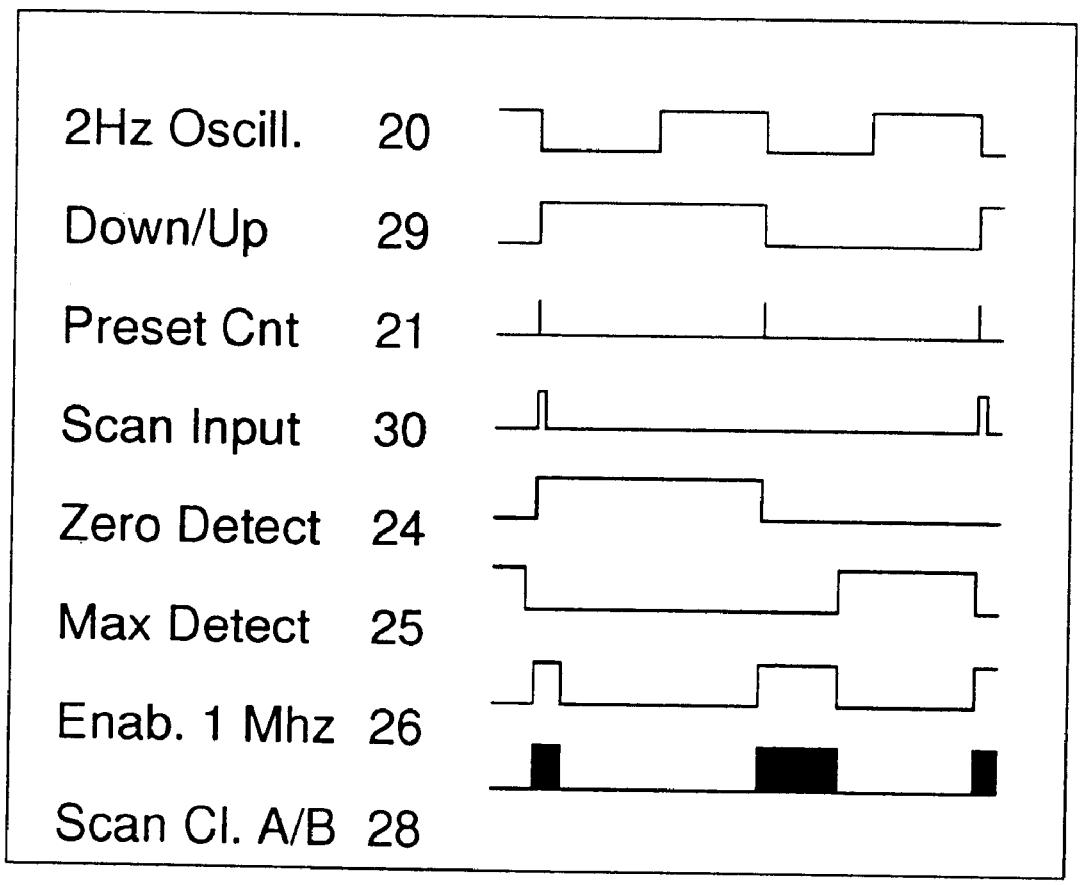
Figure 5:
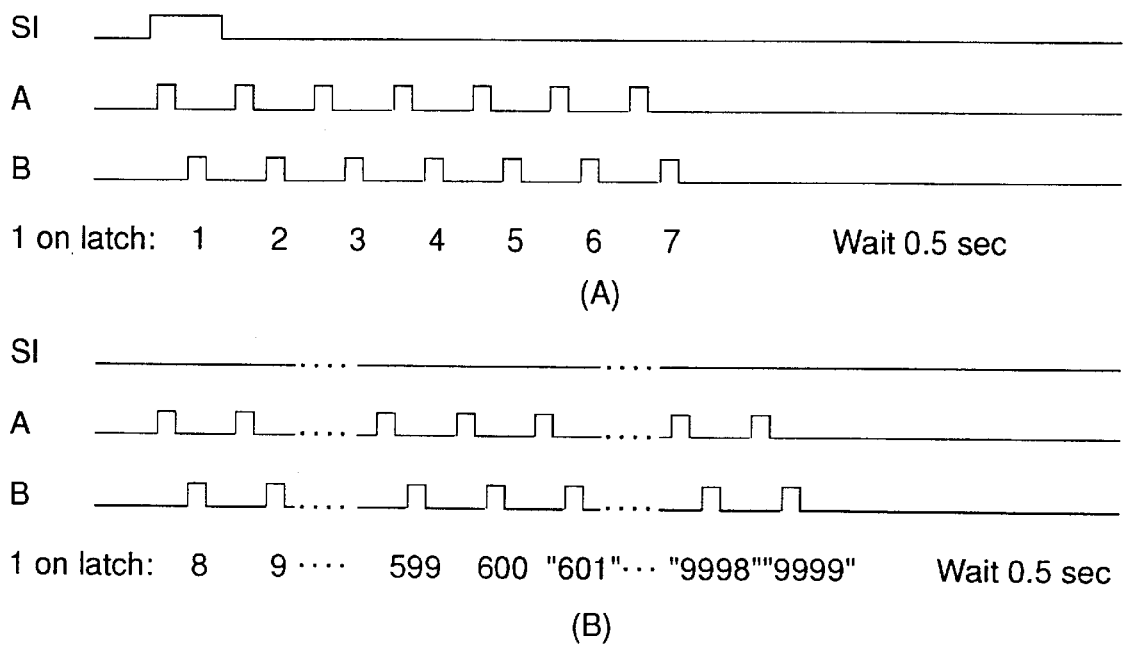
FIGS. 5a–5b respectively show timing diagrams illustrating the setting of the last latch of a shift register (or a string thereof) and the resetting of all the latches of the shift register, according to the preferred embodiment of the present invention.

The waveforms of signals at the output of logic block 14 are shown in FIG. 4b.

To summarize, logic circuit block 14 is customized to perform the following five-step loop:

1) clear all latches of the string;
2) wait for half a second;
3) load a logic "1" only in latch N;
4) wait for half a second;
5) go to step 1;

Other variations of this loop may be envisioned as well, for instance, as e.g., the following complementary sequence of steps:

1) set all latches at "1";
2) wait for half a second;
3) set only latch N at "0";
4) wait for half a second;
5) go to step 1.

By way of example, let it be assumed that a string of 7 latches forming a shift register of 600 latches is selected, and that the last latch, i.e. latch 7 is blinking. Accordingly, a "1" is loaded in this particular latch, followed by a "0" half a second later, followed by a "1" half a second later, etc., while the content of all other latches of the string is maintained at "0". A frequency of 1 Hz has been adopted because it offers the greatest comfort to the user.

FIG. 5a shows how to set latch 7 at "1". One applies a group of seven clock signals A and B, the Scan In signal SI being at the a logic "1" during the first couple of clock signals. Then "1" appears at latch 7 where it is maintained during half a second. FIG. 5(b) shows how to reset latch 7 to generate the blinking effect on the SEM screen. One must apply at least 593 (600-7) groups of clock signals to bring this "1" out of all the latches forming the string. As apparent in FIG. 5b, due to the maximum number set in the stand-alone exerciser, i.e. 9999, actually only (9999-7) groups of clock signals are applied thereat. If output net of latch 7 blinks, it means that the seven latches of the string are good; otherwise, it is clear that the failing latch belongs to the string under consideration, and the above process is repeated until a total identification of the failing latch is achieved. The failing latch is a latch whose output net does not blink, while the one in the previous latch in the string is blinking. In the present example, if another string remains to be identified, e.g., the string composed of the first three latches and the process is initiated by toggling latch 3.

The above stimuli may be also supplied by a pattern generator. Many different apparatus can be used, each offering its own mode. Some have a timing card which can generate complex timings for each vector, others may loop some vectors or a range of vectors, and some can change the rate "on the fly". Naturally, the software is adapted to the characteristics of the pattern generator being used. The example that follows applies to a basic one, without timing card, with vector depth of 4096 (in fact, this depth must be at least four times the length of the longest shift register plus 1). Three generator channels are used: for the Scan In signal SI, and for the clock signals A and B.

Figure 6:
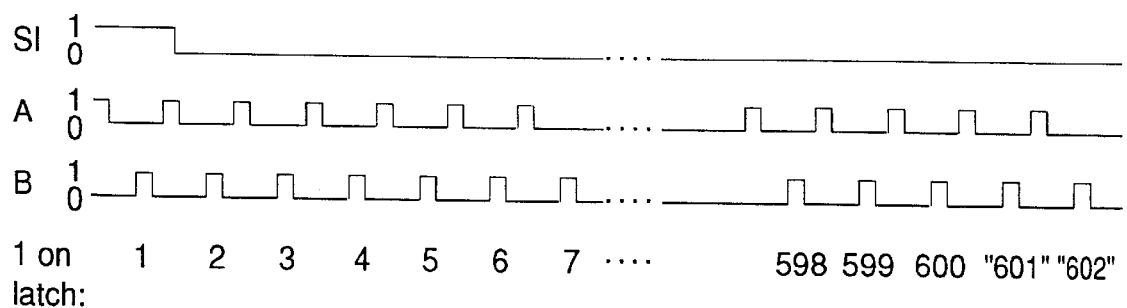
FIG. 6 shows timing diagrams illustrating the pattern of vectors to be loaded in the pattern generator according to another embodiment of the present invention.

Maintaining the same assumptions as described above, in order to set latch 7 of the selected string at "1", one has to program the starting vector at "1" and the stopping vector at 4*7. Then, this range of vectors is applied once to the string. To reset the selected latch, one has to program the starting vector at 5 (for practical reasons) and the stopping vector at 4*(601-7). When these vectors are applied to the chip, the "1" that was in latch 7 is propagated throughout the rest of the latches of the string. When it finally exits on the 600th group of clock signals, the string is deemed to be made of only good latches. Note that, on the 601st "1", the string is reset, since it is now completely filled with "0"s. Alternatively, if the "1" does not exit, it means that it has vanished somewhere within the string, which is then deemed to be defective. A truth table to be loaded in the pattern generator is shown in FIG. 6.

Apart from loading the truth table into the pattern generator, the task of the software is to alternatively start the set and reset operations, and apply waiting times between them so that the selected latch toggles at hz. The software should also prompt for any change in the rank of the latch to be toggled, the blinking rate, the frequency of the clock signals, and the like.

The method of the present invention allows a very fast visual detection of failures with a high success rate of about 90%. Typically, on the average, 7 defects are identified per man and per day. In particular, if the clock nets blink and nothing can be detected at the output net of a given latch, it clearly indicates that this latch is defective.

It is to be noted that the present invention is not limited to the specific type of analysis/diagnostic tool such as a SEM with voltage contrast capability but it could be implemented using other types of tools as well. Those skilled in the art will appreciate that these and other changes and modifications may be incorporated without departing from the scope and spirit of the present invention.

What is claimed is:

1. A method for locating a failing latch in a shift register comprised of P serially connected latches fabricated in a multi-layered integrated circuit chip, said multi-layered chip being provided with at least one interconnection layer, said method comprising the steps of:
   a) depassivating said multi-layered integrated circuit chip to expose said at least one interconnection layer;
   b) placing said depassivated multi-layered integrated circuit chip in a chamber of a scanning electron microscope, said scanning electron microscope being provided with voltage contrast capabilities;
   c) generating input clock signals to exercise said shift register;
   d) selecting a string of N latches of said shift register, wherein $1 \leq N \leq P$, and toggling a latch of said string of N latches at a frequency wherein blinking becomes visible on a display of said scanning electron microscope;
   e) displaying an area of said multi-layered integrated circuit chip which includes said blinking latch to allow locating on a terminal screen an output net of said predetermined latch;
   f) moving the beam of said scanning electron microscope to said area that includes said blinking latch;
   g) observing said displayed area to determine whether at least one output net blinks; if said at least one output net blinks, comparing said blinking output net to a corresponding output net which is displayed on a terminal screen; if said output net displayed on said terminal screen is found likewise to blink, then said string is characterized as good; and
   h) repeating steps d) to g) on another of said strings of latches until one latch in said another of said strings is identified as defective.

2. The method of claim 1 wherein the toggling of latch N further comprises the steps of:
   a) clearing all the latches of said string of latches;
   b) after a predetermined length of time, loading a logic "1" in latch N of said string; and
   c) after a predetermined length of time, repeating steps a) and b).

3. The method of claim 1, wherein toggling of said latch N further comprises the steps of:
   a) setting all latches of said string of latches at "1";
   b) after a predetermined length of time, setting only latch N at a logic "0"; and
   c) after a predetermined length of time, repeating step a).

4. The method of claim 2 wherein said toggling signal is generated by a stand-alone exerciser.

5. The method of claim 2 wherein said toggling signal is generated by a computer driven pattern generator.

6. The method of claim 5 wherein said pattern generator alternatively clears all the latches of the string and loads a logic "1" only in said latch at a predetermined time interval.

7. The method of claim 1, wherein the frequency of said toggling is about 1 Hz.

8. The method of claim 1 wherein said latch determined to be toggled is located approximately at half of said string (N=P/2).

9. The method of claim 1 wherein said area to be displayed on said terminal is part of mask data stored in a host computer.

10. A method for locating a failing latch in a shift register comprised of P serially connected latches fabricated in a multi-layered integrated circuit chip, said multi-layered chip being provided with at least one interconnection layer, said method comprising the steps of:
    a) thinning the backside of said multi-layered integrated circuit chip to render said chip transparent to a photon or to a laser beam;

b) generating clock signals to exercise said shift register;
c) selecting a string of N latches in said shift register, wherein $1 \leq N \leq P$;
d) toggling a latch of said string at a frequency to produce a blinking visible on a screen of a photon illuminator or an a laser screen;
e) displaying an area of said multi-layered integrated circuit chip that includes said toggled latch to locate an output net on a terminal screen by exploiting mask data stored in a host;
f) moving the beam to display said area on said laser screen; and
g) observing if at least one of said output net blinks on the laser screen;
   if at least one output net blinks, comparing said blinking output net of said laser screen with a corresponding one of said output nets which is displayed on a terminal screen;
   if said output net displayed on said terminal screen is found blinking on said laser screen, said string is characterized to be defect free;
h) repeating said steps c) to g) with another of said strings, said another of said string being characterized by having a greater number of latches, until a failing one of said latches is identified,
   if no output in said another of said strings blinks, then said selected another of said strings is deemed defective; and
i) repeating steps c) to g) with a new one of said strings having a lower number of latches until a failing one of said latches is identified.

* * * * *